United States Patent
Chraft et al.

(10) Patent No.: US 7,852,094 B2
(45) Date of Patent: Dec. 14, 2010

(54) SHARING RESOURCES IN A SYSTEM FOR TESTING SEMICONDUCTOR DEVICES

(75) Inventors: Matthew E. Chraft, Copperopolis, CA (US); Benjamin N. Eldridge, Danville, CA (US); Roy J. Henson, Pleasanton, CA (US); A. Nicholas Sporck, Saratoga, CA (US)

(73) Assignee: FormFactor, Inc., Livermore, CA (US)

( * ) Notice: Subject to any disclaimer, the term of this patent is extended or adjusted under 35 U.S.C. 154(b) by 669 days.

(21) Appl. No.: 11/567,705

(22) Filed: Dec. 6, 2006

(65) Prior Publication Data

US 2008/0136432 A1    Jun. 12, 2008

Related U.S. Application Data

(63) Continuation-in-part of application No. 11/566,179, filed on Dec. 1, 2006, now abandoned.

(51) Int. Cl.
*G01R 31/02* (2006.01)
(52) U.S. Cl. .............. 324/754; 324/765; 324/158.1
(58) Field of Classification Search ......... 324/754–765; 714/733, 734
See application file for complete search history.

(56) References Cited

U.S. PATENT DOCUMENTS

| | | | |
|---|---|---|---|
| 4,837,622 A | | 6/1989 | Whann et al. |
| 5,053,700 A | * | 10/1991 | Parrish ................ 324/537 |
| 5,210,485 A | | 5/1993 | Kreiger et al. |
| 5,532,614 A | * | 7/1996 | Chiu .................. 324/763 |
| 5,568,054 A | | 10/1996 | Iino et al. |
| 5,585,737 A | | 12/1996 | Shibata |
| 5,623,214 A | | 4/1997 | Pasiecznik, Jr. |
| 5,642,054 A | | 6/1997 | Pasiecznik, Jr. |
| 5,736,850 A | | 4/1998 | Legal |
| 5,818,249 A | | 10/1998 | Momohara |
| 6,064,213 A | | 5/2000 | Khandros et al. |
| 6,452,411 B1 | | 9/2002 | Miller et al. |
| 6,499,121 B1 | | 12/2002 | Roy et al. |
| 6,714,828 B2 | | 3/2004 | Eldridge et al. |
| 6,729,019 B2 | | 5/2004 | Grube et al. |
| 7,230,437 B2 | | 6/2007 | Eldridge et al. |
| 7,245,134 B2 | | 7/2007 | Granicher et al. |
| 7,282,933 B2 | | 10/2007 | Henson et al. |

(Continued)

OTHER PUBLICATIONS

U.S. Appl. No. 11/469,788, filed Sep. 1, 2006, Henson et al.

(Continued)

*Primary Examiner*—Vinh P Nguyen
(74) *Attorney, Agent, or Firm*—Kirton & McConkie

(57) ABSTRACT

Probes in a plurality of DUT probe groups can be connected in parallel to a single tester channel. In one aspect, digital potentiometers can be used to effectively switch the tester channel from a probe in one DUT probe group to a probe in another DUT probe group. In another aspect, switches in parallel with a resistor can accomplish such switching. In yet another aspect, a chip select terminal on each DUT can be used to effectively connect and disconnect internal DUT circuitry to the tester channel. Multiple DUT probe groups so connected can be used to create different patterns of DUT probe groups for testing different patterns of DUTs and thus facilitate sharing tester channels.

18 Claims, 5 Drawing Sheets

U.S. PATENT DOCUMENTS

| | | |
|---|---|---|
| 7,307,433 B2 | 12/2007 | Miller et al. |
| 2001/0015652 A1 | 8/2001 | Eldridge et al. |
| 2002/0145437 A1 | 10/2002 | Sporck et al. |
| 2003/0030453 A1 | 2/2003 | Mayder et al. |
| 2004/0227532 A1 | 11/2004 | Orsillo |
| 2006/0273809 A1 | 12/2006 | Miller et al. |
| 2007/0296422 A1 | 12/2007 | Miller |

OTHER PUBLICATIONS

PCT Search Report PCT/US 07/85483 (Sep. 5, 2008).

\* cited by examiner

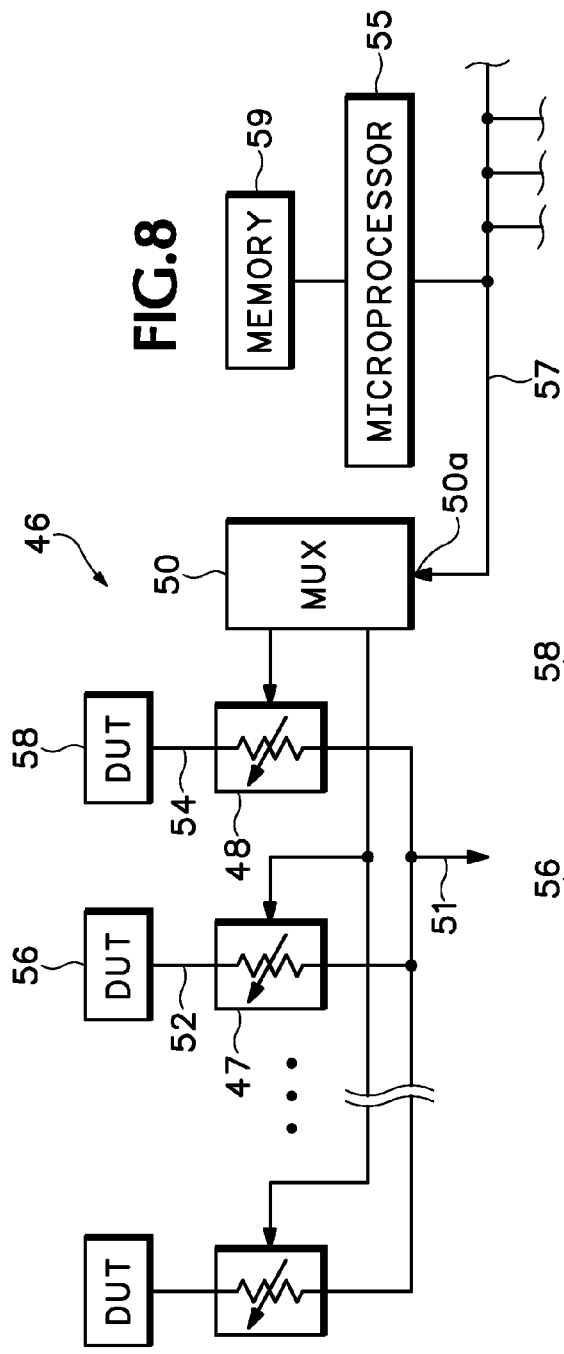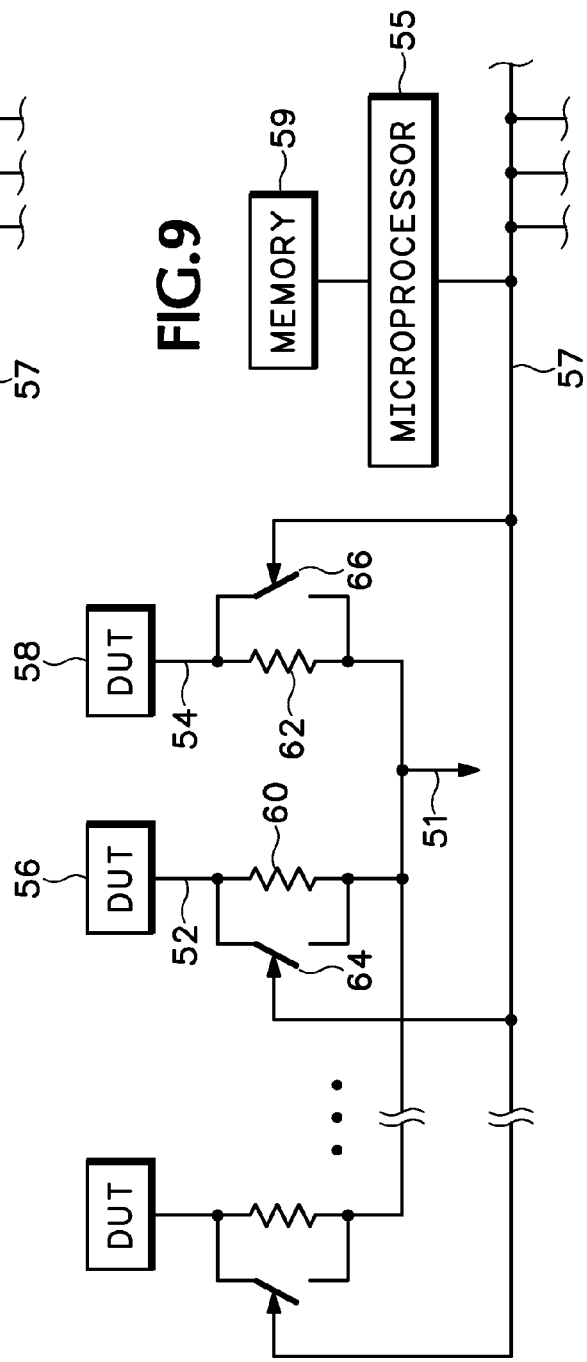

SHARING RESOURCES IN A SYSTEM FOR TESTING SEMICONDUCTOR DEVICES

CROSS REFERENCE TO RELATED APPLICATIONS

This application is a continuation-in-part of U.S. patent application Ser. No. 11/566,179 filed Dec. 1, 2006, now abaondonded.

BACKGROUND

Semiconductor devices, such as microprocessors, dynamic random access memory (DRAM), and flash memory, are fabricated in a known manner on a semiconductor wafer. Depending upon the size of the wafer and of each device formed thereon, there may be as many as several hundred devices on a single wafer. These devices are typically identical to one another, each including a plurality of conductive terminals on the surface thereof for power and other connections to the devices such as input signals, output signals, control signals and the like.

Oftentimes, it is desirable to test the devices on the wafer to determine which are functional and which are inoperative or partially functional. To this end, wafer testers apply power and input signals to the devices and monitor outputs during a predetermined testing routine while the devices are still on the wafer.

Because each DUT is substantially identical to the others, there can be a plurality of identical DUT probe groups. Each DUT probe group includes probes that make discrete pressure connections to separate ones of the terminals on a corresponding DUT.

These DUT probe groups can be attached to a substrate. This substrate and the probes in the DUT probe groups together form a probe head that is part of the tester system. The wafer tester typically includes multiple channels, one for each probe in the DUT probe groups on the probe head. As a result, multiple DUT probe groups simultaneously contact multiple DUTs on the wafer.

Obviously, the more DUTs that can be simultaneously tested, the faster the entire wafer can be tested. But there is a limit to the number of tester channels that can be connected to the DUT probe groups. While some testers contain many channels, e.g., 128 channels, there may be several hundred DUTs on the wafer to be tested. The testing process consequently includes bringing the DUT probe groups and terminals on a first corresponding set of DUTs into contact with one another, performing the test, lifting the probes from the DUTs, moving the probes and wafer relative to one another, bringing the probes into contact with terminals on another set of DUTs, and testing additional DUTs. This process is repeated until all the DUTs on the wafer are tested.

Efficiency is increased if a probe head having more probes in DUT probe groups than there are tester channels is used in a manner that permits rapid and effective switching of tester channels from probes in one group of DUT probe groups to probes in another DUT probe group. This can effectively reshape the number and pattern of operational DUT probe groups on the probe head.

BRIEF DESCRIPTION OF THE DRAWINGS

FIG. 8 is a highly schematic view of a portion of a circuit constructed in accordance with some embodiments of the invention.

FIG. 9 is a highly schematic view of a portion of a circuit constructed in accordance with some embodiments of the invention.

Figure 1:
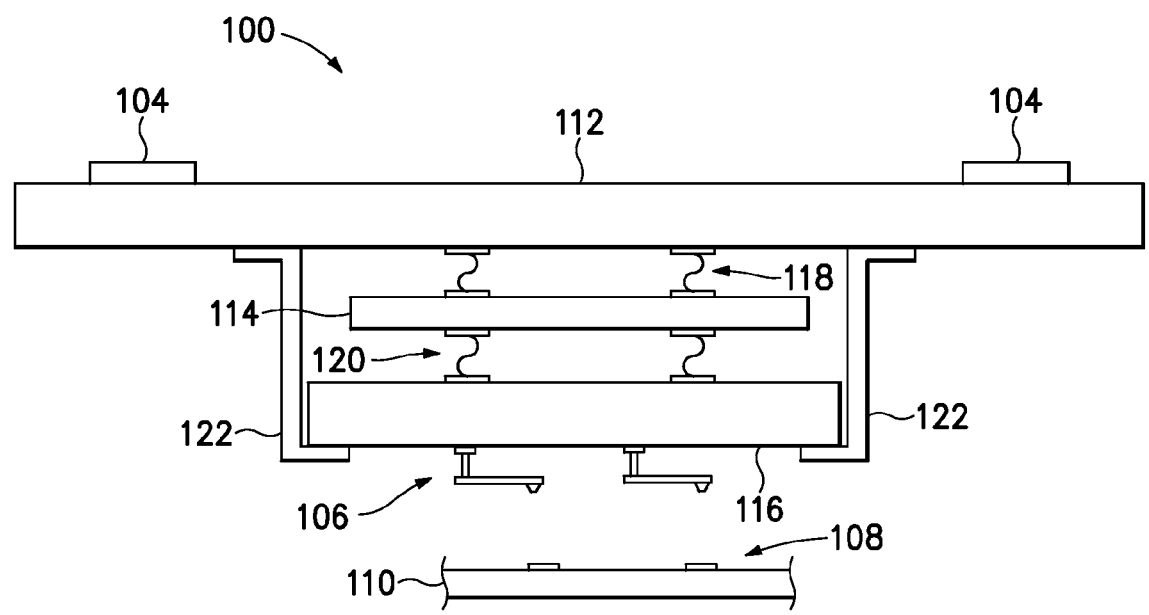
FIG. 1 is a somewhat schematic view of a probe card assembly including a probe head mounted thereon according to some embodiments of the invention.

The figures presented in conjunction with this description are views of only particular—rather than complete—portions of the devices and methods of making the devices. Together with the following description, the figures demonstrate and explain the principles of such devices and methods according to some embodiments of the invention. In the figures, the thickness of layers and regions may be exaggerated in some instances for clarity. It will also be understood that when a layer is referred to as being "on" another layer or substrate, it can be directly on the other layer or substrate, or intervening layers may also be present. The same reference numerals in different drawings represent the same element, and thus their descriptions will be omitted.

DETAILED DESCRIPTION OF EXEMPLARY EMODIMENTS

This specification describes exemplary embodiments and applications of the invention. The invention, however, is not limited to these exemplary embodiments and applications or to the manner in which the exemplary embodiments and applications operate or are described herein.

In general, some embodiments of the invention provide ways to connect channels on a tester to different probes on a probe card assembly. For example, during testing of DUTs on a semiconductor wafer, a first set of tester channels could be connected to a first set of probe groups on the probe card assembly during a first touchdown that makes pressure connections between terminals on some of the DUTs and the connected probe groups. Either while the pressure connection is maintained or after it is removed, e.g., between the first and a second touchdown, at least some of the first set of tester channels can be switched to a different set of DUT probe groups on the probe card assembly for further testing of the DUTs. This switching can be accomplished in various ways, e.g., with digital potentiometers, with a chip select port on each DUT that could be selected using a signal on one of the probes, or in response to the pressure generated by the touchdown. In addition, during a single touchdown, a single channel may be used to drive a plurality of probes, which can be pressure connected to different DUTs.

A non-limiting exemplary probe card assembly 100 (which can be a non-limiting example of a contactor device) illustrated in FIG. 1 can be used to test one or more DUTs in accordance with some embodiments of the invention. DUTs can be any electronic device or devices to be tested. Non-limiting examples of DUTs include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. Note that the term DUT, as used herein, refers to one or a plurality of such electronic devices.

Probe card assembly 100 can include electrical connectors 104, which can make electrical connections with a plurality of tester channels (not shown) from the tester (not shown). A tester (not shown) can comprise a computer or computers and/or other electronic elements configured to control testing of DUTs. For example, a tester can generate patterns of test signals that are to be input into the DUTs, and the tester can evaluate response signals produced by the DUTs in response to the test signals to determine whether the response signals are as expected and, consequently, whether the DUTs passed the testing. (As used herein, the term "test signals" can refer to the signals input into the DUTs and/or to the response signals generated by the DUTs.) Communications channels (not shown) (e.g., coaxial cables, fiber optic links, wireless transmitters/receives, drivers, receivers, etc. or any combination of the foregoing) can be provided to and from the tester. A communication channel can be provided for each input and output of a DUT that is to be tested. Power, ground, and input signals for testing a DUT can be provided from the tester through ones of the communications channels, and response signals generated by a DUT can be provided to the tester through other communication channels. As will be seen, probe card assembly 100 can include electrical connectors 104 having individual connections to the channels from the tester, and the probe card assembly can also include electrically conductive paths between the channel connections of the electrical connectors 104 and probes 106 configured to be pressed against and thus make electrical connections with input and/or output terminals 108 of a DUT 110 (for example), which are non-limiting examples of contacts. The probe card assembly 100 can thus provide an electrical interface between communications channels from the tester and input and/or output terminals 108 of DUTs 110.

As shown in FIG. 1, probe card assembly 100 can comprise one or more substrates configured to support connectors 104 and probes 106 and provide electrical connections between connectors 104 and probes 106. The exemplary probe card assembly 100 shown in FIG. 1 has three such substrates, although in other implementations, probe card assembly 100 can have more or fewer substrates. Shown in FIG. 1 are a wiring substrate 112, which may be a probe card, an interposer substrate 114, and a probe substrate 116. Wiring substrate 112, interpose substrate 114, and probe substrate 116 can be made of any type of material. Examples of suitable substrates include without limitation printed circuit board, a ceramic substrate, an organic or inorganic substrate, etc. Combinations of the foregoing are also possible. Probe substrate 116 with probes 106 can be or can be part of a probe head.

Electrically conductive connections (not visible) can be provided from connectors 104 through wiring substrate 112 to electrically conductive spring interconnect structures 118. Other electrically conductive connections (not visible) can be provided from spring interconnect structures 118 through interposer substrate 114 to electrically conductive spring interconnect structures 120, and still other electrically conductive connections (not visible) can be provided from spring interconnect structures 120 through probe substrate 116 to probes 106. The electrical connections (not shown) through the wiring substrate 112, interposer substrate 114, and probe substrate 116 can comprise electrically conductive vias, traces, etc. on, within, and/or through wiring substrate 112, interposer substrate 114, and probe substrate 116. The electrical connections (not shown) through the wiring substrate 112, the electrically conductive spring structures 118, the electrical connections (not shown) through the interposer substrate 114, spring structures 120, and the electrical connections (not shown) through the probe substrate 116 can form a plurality of electrically conductive paths electrically connecting individual channel connections in electrical connectors 104 with individual probes 106. There can be a one-to-one correspondence between individual channel connections in the electrical connectors 104 and the probes 106. Alternatively or in addition, ones or all of the electrical paths (not shown) from the electrical connectors 104 to the probes can electrically connect one channel connection in the electrical connectors 104 with more than one probe 106.

Wiring substrate 112, interposer substrate 114, and probe substrate 116 can be held together by brackets 122 and/or other suitable means. The configuration of probe card assembly 100 shown in FIG. 1 is exemplary only and is simplified for ease of illustration and discussion. Many variations, modifications, and additions are possible. For example, a probe card assembly 100 can have fewer or more substrates (e.g., 112, 114, 116) than the probe card assembly 100 shown in FIG. 1. As another example, the probe card assembly 100 can have more than one probe substrate (e.g., 116), and each such probe substrate can be independently adjustable. Non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. No. 5,974,662 and U.S. Pat. No. 6,509,751 and the aforementioned U.S. patent application Ser. No. 11/165,833, filed Jun. 24, 2005, and various features of the probe card assemblies described in those patents and application can be implemented in the probe card assembly 100 show in FIG. 1.

Figure 2:
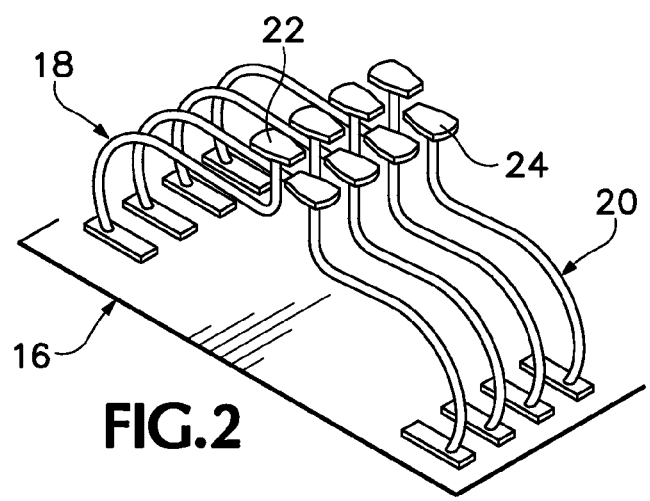
FIG. 2 is a significantly enlarged view of a portion of a DUT probe group on the probe head of FIG. 1.

DUT probes 106 can be arranged on substrate 116 into groups (referred to herein as DUT probe groups) in which each DUT probe group includes a number and arrangement of probes for contacting the terminals 108 of one DUT 110. A sufficient number of such DUT probe groups can be included on the probe substrate 116 to contact and test a plurality of DUTs 110 simultaneously. FIG. 2 depicts a portion of an example of one DUT probe group 16, which can include a pattern of probes, like probes 18, 20. (Probes 18, 22 can be examples of probes 106.) The configuration in FIG. 2 is exemplary of the many different types that can be used. In some embodiments, the probes in FIG. 2 can make up only a portion of the probes in a DUT probe group 16. Each DUT probe group may include 60 to 80 or more probes like those shown in FIG. 2, although in some instances there may be many fewer or many more. Because the wafer to be tested typically includes DUTs 110 that are identical to one another, including the terminal 108 configuration on each DUT 110, the DUT probe groups formed on substrate 116 can also be identical to one another. Each of the probes can include a tip, like tip 22 on probe 18 and tip 24 on probe 20. As will be soon described, during wafer testing, probes in DUT probe group 16 can be positioned opposite a wafer, similar to the depiction of FIG. 1, and the wafer can be moved up toward the probes 106 until the probe tips, like tips 22, 24 (in FIG. 2) contact corresponding terminals on the DUTs on the wafer.

The probes may be of any type, including needle probes, buckling beam probes, bump probes, or spring probes. The probe bodies may be resilient, conductive structures. Non-limiting examples of suitable probes include composite structures formed of a core wire that is over coated with a resilient material as described in U.S. Pat. No. 5,476,211, U.S. Pat. No. 5,917,707, and U.S. Pat. No. 6,336,269. The probes may alternatively be lithographically formed structures, such as the spring elements disclosed in U.S. Pat. No. 5,994,152, U.S. Pat. No. 6,033,935, U.S. Pat. No. 6,255,126, U.S. patent Application Publication No. 2001/0044225, and U.S. patent Application Publication No. 2001/0012739. Other non-limiting examples of probes include those disclosed in U.S. Pat. No. 6,827,584, U.S. Pat. No. 6,640,432, and U.S. patent Publication No. 2001/0012739. Pogo pins, buckling beam probes (e.g., cobra probes), and other types of probes may also be used.

Similarly, regardless of probe type, the probe tip could be in the shape of a pyramid, truncated pyramid, blade, bump, or any other suitable shape. Non-limiting examples of various shapes and sizes are described in U.S. Pat. No. 6,441,315.

The probes that form DUT probe group 16 can be mounted on substrate 116. The substrate 116 can comprises a multi-layer ceramic substrate that can include a ground plane and a power plane connected to the appropriate probes in the DUT probe groups, such as DUT probe group 16, on substrate 116 for applying power to each DUT during testing. Substrate 116 may be a space transformer and/or can be made up of one or more tiles, each containing a portion of the DUT probe groups, such as DUT probe group 16. As discussed above, each of the probes in the DUT probe group 16 can be connected via different electrical paths through the substrates 116, 114, 112 to an individual channel connection in connectors 104 on a wiring substrate 112. Alternatively or in addition, such electrical paths can electrically connect one channel connection in the connectors 104 to more than one probe 106.

As is known in the art, the electrical paths between the connectors 104 and the probes 106 may be made via interposer 114 (in FIG. 1) disposed between space transformer 114 and wiring substrate 112. There may be a few, tens, scores, hundreds, or even thousands of such paths. As mentioned and as will later be described in more detail, the connectors 104 on wiring substrate 112 can include individual channel connections that can be connected to communications channels (not shown) from a tester (not shown). Connectors 104 can thus be used to connect the probes 106 to communications channels (not shown) to and/or from a tester (not shown).

The DUT configuration, including the number, layout, and signal assignments of the terminals 108 of the DUTs 110, on each wafer can vary as a result of a number of different factors, e.g., different manufacturers, different products, different wafer sizes, etc. As a result, the number, pattern, and signal assignments of probes in DUT probe groups on the probe substrate 116 are designed according to the wafer DUT pattern that results from these factors.

Figure 3:
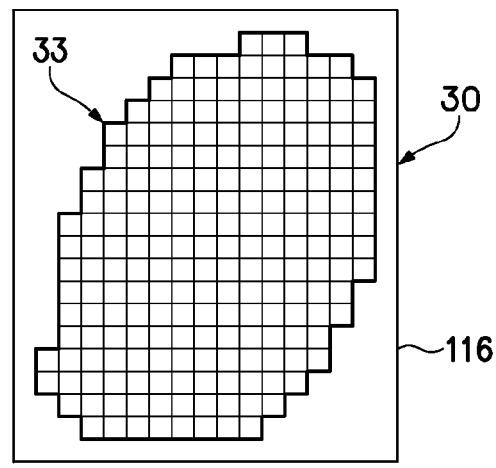
FIG. 3 is a schematic depiction of a configuration of DUT probe groups on a probe head according to some embodiments of the invention.

Turning first to FIG. 3, indicated generally at 30 is a probe head, which includes a probe group configuration 33 formed on substrate 116, in FIG. 1, with probes 106 comprising probes in probe group configuration 33. Probe group configuration 33 can include a total of 201 DUT probe groups, each of which is indicated by one of the squares in FIG. 3. Embodiments of the invention may be implemented with fewer or more probe groups; 201 is an exemplary number used only to describe this non-limiting example. As mentioned above, each DUT probe group in probe group configuration 33 may be substantially identical to one another for testing substantially identical DUTs on a semiconductor wafer. It should be appreciated, however, that the present invention may be implemented to test singulated dies.

Figure 4:
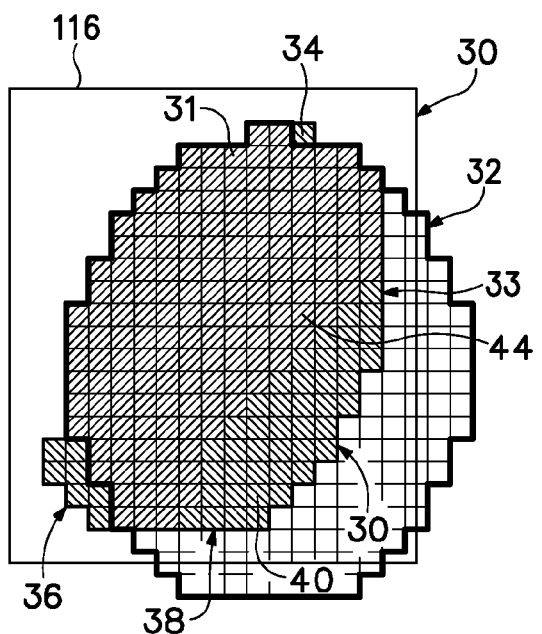
FIG. 4 shows the probe head of FIG. 3 during a first touchdown on a wafer having a plurality of DUTs, each being represented schematically by a square within a bold line that represents the perimeter of the DUTs on the wafer.

Turning to FIG. 4, the probe head 33 is shown superimposed over a semiconductor wafer, the perimeter of which is not shown, having a plurality of DUTs formed thereon, in a DUT pattern 32. Each of the DUTs in pattern 32 is indicated by a square of the same size as the squares indicating the DUT probe groups on the probe head 30. A hatched line indicates each of the DUT probe groups on the probe head 30. The significance of the different directions of hatching on some of the DUT probe groups will be explained shortly.

Figure 5:
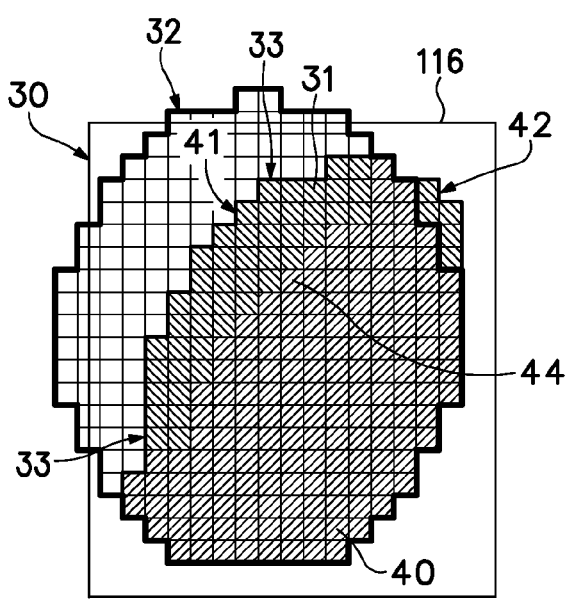
FIG. 5 is a view similar to FIG. 4 showing the probe head during a second touchdown.

A bold line in FIGS. 4 and 5 defines the perimeter of the DUTs formed on the semiconductor wafer, i.e., the perimeter of DUT pattern 32. There are a total of 290 DUTs in pattern 32 to be registered with one of the 201 probe groups in probe group configuration 33 at least once during two touchdowns of the probe group. But this embodiment is implemented with a tester that has fewer than 201 channels, i.e., there are fewer tester channels than there are probes in the probe groups. As will be seen, some of the tester channels can be routed to different DUT probe groups between the first and second touchdowns. As will be seen, this allows testing of each of the 290 DUTs in irregularly shaped DUT pattern 32 using a tester with fewer channels than there are probes in the DUT probe groups. The number 290 of DUTs is exemplary only, and other numbers of DUTs (e.g., more or fewer) can be tested in other configurations.

Referring again to FIG. 1, as discussed above, the probe card assembly 100 can be connected to a tester (e.g., to channels from the tester). As also generally discussed above, the tester can be programmed in a manner known in the art in combination with a wafer prober to move the wafer under test against selected one of the DUT probe groups, to apply test signals and power to the DUTs, and to receive output signals from the DUTs. In an exemplary embodiment, the tester can have 150 channels, which can be organized into channel groups. Each of the channel groups can correspond to a DUT probe group. For example, each channel group can include individual channels that correspond in number and signal assignments to individual probes in a DUT probe group. Thus, a channel group can include sufficient channels to provide, through a probe group, power and ground connections and signal input connections to a DUT, and the channel group can also include sufficient channels to connect, through probes in the probe group, to the output terminals of the DUT.

As can be seen in FIG. 4, a number of the DUT probe groups can be registered with a corresponding number of DUTs on the wafer. But many of the DUTs are not registered with a corresponding DUT probe group because there are fewer DUT probe groups than there are DUTs. In addition, some of the DUT probe groups, like DUT probe group 34 and several DUT probe groups 36, extend beyond DUT pattern 32 and thus are not opposite (and thus not in contact with) a DUT.

To operate the probe head 30 of FIG. 3 in a 150-channel tester, the probe head 30 and the wafer can be positioned relative to one another as shown in FIG. 4 with probes on the DUT probe groups in DUT probe group configuration 33 opposite corresponding terminals on some of DUTs in pattern 32. The 150 tester channels can then be routed to 150 of the DUT probe groups in configuration 33, namely those in FIG. 4 that are hatched from lower left to upper right, like DUT probe group 31. This leaves a section 38 of DUT probe groups (shown hatched from upper left to lower right), including DUT probe group 40, over a corresponding DUT in DUT pattern 32 but effectively disconnected from any tester channels. In addition, DUT probe group 34 and DUT probe groups 36 (both hatched from upper left to lower right) are not opposite DUTs, i.e., they extend beyond DUT pattern 32. Probe groups 34, 36 are also effectively disconnected. All of the disconnected DUT probe groups are shown hatched from upper left to lower right. Exemplary manners of connecting and disconnecting the DUT probe groups to tester channels will be described shortly.

After effectively disconnecting and connecting the DUT probe groups in configuration 33 as shown in FIG. 4 and discussed above, the wafer and the probes can be moved relative to one another until the probes make contact with terminals on the DUTs. Alternatively, the wafer and the probes can be moved relative to one another to make contact between probes and DUT terminals, and thereafter DUT probe groups in configuration 33 can be disconnected and connected as described above. Regardless of whether the disconnecting and connecting occurs before or after contact between the probes and DUT terminals is effected, once contact is effected, DUTs can be supplied with power from the appropriate probes in the DUT probe groups in configuration 33 that are hatched from lower left to upper right, and a predetermined test or tests can be simultaneously run on each of the DUTs in pattern 32 that is opposite a connected DUT probe group. Various input signals can be supplied to the DUT, and DUT outputs can be monitored to determine whether the DUT is functioning as designed. After the test or tests are run and a determination is made as to which DUTs pass the testing and which do not, the probe head and the wafer can be separated from one another, and the probe head can be stepped, e.g., moved laterally relative to the wafer, to the position of FIG. 5.

Before the second touchdown, which is depicted in FIG. 5, some of the tester channels can be switched to a different set of DUT probe groups, namely some of those that were effectively disconnected in the first touchdown. Like FIG. 4, those DUT probe groups that are effectively disconnected from tester channels are shown hatched from upper left to lower right in FIG. 5, namely the DUT probe groups in sections 41, 42. And those that are effectively connected to a tester channel are hatched from lower left to upper right.

It should be appreciated that embodiments can be implemented in which the tester channels are switched and additional testing of previously untested DUTs is performed during the first touchdown. Alternatively, the switching may occur during the first touchdown and the probe head and wafer separated and stepped without further testing during the first touchdown.

In FIG. 5, 150 channels are each connected to a DUT probe group as depicted by the hatching and described above. Probe group 30 and the wafer are then again moved into contact with one another so that the probes make pressure connections against corresponding terminals on the DUTs. There are a few DUTs, e.g., DUT 44, that are subject to two touchdowns by effectively connected DUT probe groups, one in FIG. 4 and a different one in FIG. 5. These DUTs, like DUT 44, need not be tested twice. They can be dealt with by programming the tester not to retest such DUTs during the second touchdown. Alternatively, the tester can retest such DUTs during the second touchdown in the same manner as the DUTs were tested during the first touch down. This can leave fewer than 150 channels connected during the second touchdown but still tests all the DUTs without testing any twice. After the second touchdown, power can again be applied to the DUTs and the same tests can be run thereby testing the remaining DUTs.

Figure 6:
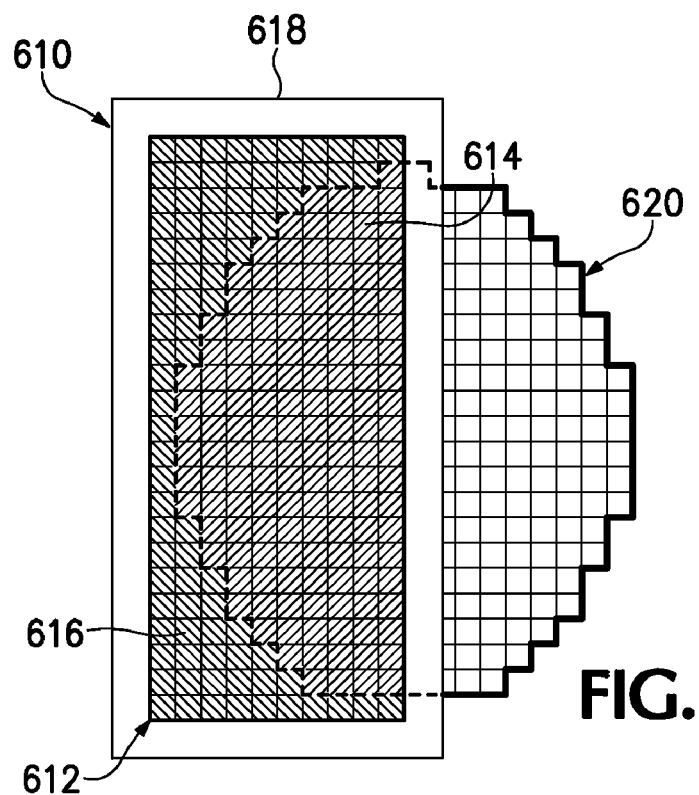
FIG. 6 shows another probe head constructed according to some embodiments of the invention during a first touchdown on a wafer having a plurality of DUTs, each being represented schematically by a square within a bold line that represents the perimeter of the DUTs on the wafer.
Figure 7:
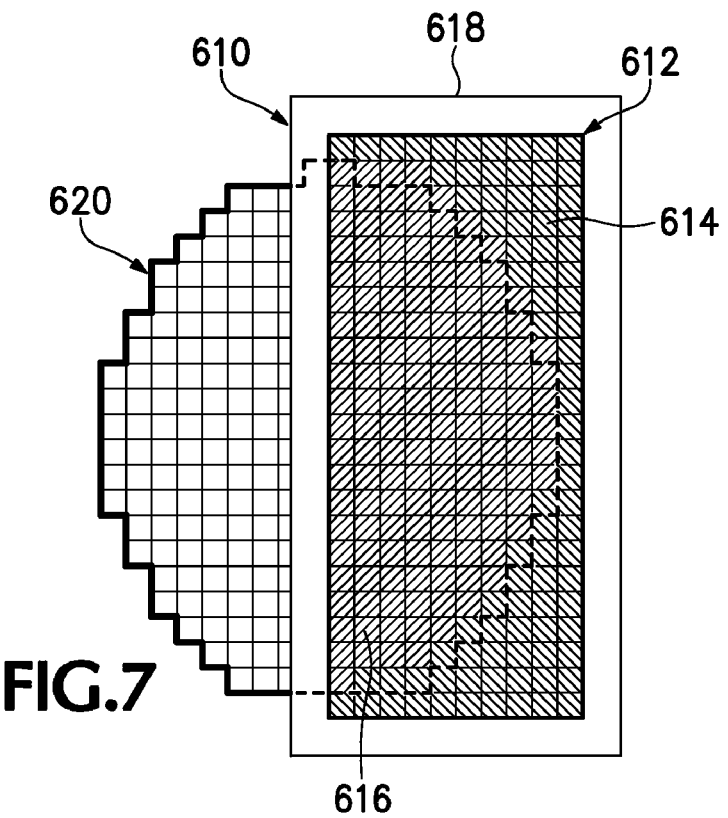
FIG. 7 is a view similar to FIG. 6 showing the probe head during a second touchdown.

Another embodiment of the invention is depicted in FIGS. 6 and 7. Indicated generally at 610 is a probe head that includes a DUT probe group configuration 612. Probe group configuration 612 includes a plurality of DUT probe groups that are depicted schematically by squares, two of which are DUT probe groups 614, 616. The DUT probe groups can be mounted on a substrate, which in the exemplary embodiment of FIGS. 6 and 7, comprises a substrate 618 (e.g., like substrate 116 of FIG. 1), which can be part of a probe card assembly (e.g., like probe card assembly 100 of FIG. 1). As mentioned above, each DUT probe group in probe group configuration 612 may be substantially identical to one another for testing substantially identical DUTs on a semiconductor wafer. It should be appreciated, however, that the present invention may be implemented to test singulated dies or other types of DUTs.

Probe head 610 is shown superimposed over a semiconductor wafer, the perimeter of which is not shown, having a plurality of DUTs formed thereon in a DUT pattern 620, which is the same DUT pattern depicted in FIGS. 4 and 5. A line defines the perimeter of DUT pattern 620—bold where not obscured and dashed when DUT pattern 620 is covered by probe head 612. Each of the DUTs in DUT pattern 620 is indicated by a square of the same size as the squares indicating the DUT probe groups, such as DUT probe groups 614, 616, on probe head 610. A bold line in FIGS. 6 and 7 defines the perimeter of the DUTs in DUT pattern 620 formed on the semiconductor wafer. A hatched line indicates each of the DUT probe groups, including DUT probe groups 614, 616, on probe head 610. The significance of the different directions of hatching on some of the DUT probe groups is the same as FIGS. 4 and 5, i.e. hatching from upper left to lower right indicates an effectively disconnected probe group, and hatching from lower left to upper right indicates an effectively connected DUT probe group. Probe head 610 can be connected to a tester (not shown) in a manner similar to that described for probe head 30. The tester (not shown) can include fewer tester channels than there are DUT probe groups—two of which being DUT probe groups 614, 616—on the probe head.

As a result, some of the tester channels can be routed to different DUT probe groups between the first touchdown, depicted in FIG. 6, and the second touchdown, depicted in FIG. 7. As will be seen, this can allow testing of each of the DUTs in irregularly shaped DUT pattern 620 using a tester with fewer channels than there are probes in the DUT probe groups.

When probe head 610 is incorporated into a probe card assembly, e.g., in the same manner probe substrate 116 is incorporated into probe card assembly 100 in FIG. 1, the probe head 610 can be connected to a tester (not shown). The tester can be programmed in a manner known in the art in combination with a wafer prober (not shown) to move the wafer under test against selected ones of the probe groups, such as DUT probe groups 614, 616; to apply test signals and power to the DUTs in selected ones of the DUTs in DUT pattern 620; and to receive output signals from those DUTs.

As can be seen in FIG. 6, a number of the DUT probe groups, one of which is DUT probe group 614, can be registered with a corresponding DUT in DUT pattern 620. But many of the DUTs, e.g., those on the right side of the DUT pattern 620, are not registered with a corresponding DUT probe group because there are fewer DUT probe groups in DUT probe group configuration 612 than there are DUTs in DUT pattern 620. In addition, some of the DUT probe groups, e.g., DUT probe 616, extend beyond DUT pattern 620 and thus are not opposite a DUT.

To operate probe head 610 to test DUTs in DUT pattern 620, probe head 610 and the semiconductor wafer on which DUT pattern 620 is formed can be positioned relative to one another as shown in FIG. 6 with probes on the DUT probe groups, such as DUT probe group 614, being opposite corresponding terminals on some of the DUTs in DUT pattern 620. As can be seen in FIG. 6, DUT probe group 614 is over a corresponding DUT on DUT pattern 620 while DUT probe group 616 is not over a corresponding DUT. In fact, it may not be over any part of the wafer on which DUT pattern 620 is formed or it may be over a part of the wafer that does not include DUT pattern 620. All of the DUTs on the left side of DUT pattern 620 are opposite a corresponding DUT probe group, such as DUT probe group 614.

While probe head 610 and DUT pattern 620 are positioned relative to one another as shown in FIG. 6, tester channels can be connected to probes in ones of the DUT probe groups—such as probe group 614—that are across from a corresponding DUT, namely those in FIG. 6 that are hatched from lower left to upper right, like DUT probe group 614. This leaves a number of DUT probe groups (shown hatched from upper left to lower right), like DUT probe group 616, effectively disconnected from any tester channels. Exemplary manners of connecting and disconnecting the DUT probe groups to tester channels will be described shortly.

After effectively disconnecting and connecting the DUT probe groups in DUT probe group configuration 612 as shown in FIG. 6, the wafer (not shown) and the probes can be moved relative to one another until the probes make contact with terminals on the DUTs. Again, however, the disconnecting and connecting can occur after effecting contact between the probes and terminals on the DUTs. Regardless of whether the disconnecting and connecting occurs before or after effecting contact, once contact has been effected between probes and DUT terminals, each DUT can be supplied with power from the appropriate probes in DUT probe group configuration 612 that are hatched from lower left to upper right, and a predetermined test or tests can be simultaneously run on each of the DUTs in DUT pattern 620 that is opposite a connected DUT probe group. Various input signals can be supplied to each DUT, and DUT outputs can be monitored to confirm that the DUT is functioning as designed. After the test or tests run and a determination is made as to which DUTs pass and which do not, probe head 610 and the wafer can be separated from one another, and the probe head can be stepped, e.g., moved laterally relative to the wafer, to the position of FIG. 7.

Before the second touchdown, which is depicted in FIG. 7, some of the tester channels can be switched to a different set of DUTs, namely some of those that were effectively disconnected in the first touchdown. Alternatively, switching of the tester channels can occur after the second touchdown. Like FIG. 6, those DUTs that are effectively disconnected are shown hatched from upper left to lower right in FIG. 7, such as DUT probe group 614, and those that are effectively connected to a tester channel are hatched from lower left to upper right, such as DUT probe group 616.

It should be appreciated that the invention may be implemented in embodiments in which the tester channels are switched and additional testing of previously untested DUTs is performed during the first touchdown. Alternatively, the switching may occur during the first touchdown and the probe head and wafer separated and stepped without further testing during the first touchdown. Also, the probe head may move in any direction and cover different numbers of DUTs in each touchdown.

In FIG. 7, channels are each connected to probes of ones of the DUT probe group as depicted by the hatching. DUT probe group configuration 612 and some of the DUTs in DUT pattern 620 are then moved into contact with one another so that probes make a pressure connection against corresponding terminals on the DUTs. After the second touchdown, power can again be applied to the DUTs and the same test or tests can be run thereby testing the remaining DUTs. As a result, each of the DUTs in DUT pattern 620 can be touched and tested using a tester that has fewer channels than the number of DUT probe groups.

Turning now to FIG. 8, indicated generally at 46 is a portion of a circuit constructed in accordance with some embodiments of the present invention. As will be discussed, the circuit shown in FIG. 8 can be implemented in whole or in part on a probe card assembly like the probe card assembly 100 of FIG. 1.

As shown in FIG. 8, circuit 46 can include a signal line 51, which can be electrically connected to a source of test signals. For example, signal line 51 can be electrically connected to a channel connection in electrical connectors 104 of FIG. 1. As such, signal line 51 can be part of an electrically conductive path (e.g., a first path) between electrical connectors 104 and probes 106 of FIG. 1. Exemplary implementations of such paths are discussed above with respect to FIG. 1. As shown in FIG. 1, the signal line 51 can be electrically connected to a plurality of probes (e.g., a first set of probes) through potentiometers. As also shown, the probes can be brought into contact with or otherwise form electrical connections with input and/or output terminals of DUTs. Three probes, three potentiometers, and three DUTs are shown in FIG. 8 but signal line 51 can be connected to more or fewer probes through more or fewer potentiometers, and the probes can contact more or fewer DUTs. Two of the probes are labeled 52, 54 in FIG. 8, two of the potentiometers are labeled 47, 48 in FIG. 8, and two of the DUTs are labeled 56, 58 in FIG. 8. Hereinafter, reference to potentiometers 47, 48 can include any or all of the potentiometers shown in FIG. 8. Likewise, reference to probes 52, 54 and DUTs 56, 58 can include any or all of the probes shown in FIG. 8 and any or all of the DUTs shown in FIG. 8, respectively. The probes 52, 54 shown in FIG. 8 can be like probes 106 of FIG. 1 and can be configured to contact input and/or output terminals (not shown in FIG. 8) of the DUTs 56, 58, each of which can be like DUT 110 with terminals 108 in FIG. 1.

A plurality of circuits like circuit 46 can be provided on the probe card assembly 100. For example, such additional circuits can connect other signal lines (which can be like signal line 51) to other channel connections in electrical connectors 104 (see FIG. 1). Such additional signal lines can also be connected through potentiometers like potentiometers 47, 48 to probes like probes 52, 54. Some such additional probes can contact the DUTs 56, 58 shown in FIG. 8 and thus, with the probes 52, 54 shown in FIG. 8, can form DUT probe groups (e.g., like DUT probe group 16 or any other DUT probe group disclosed herein) for contacting all or many of the terminals of the DUTs 56, 58. Others of the additional probes can contact other DUTs (not shown in FIG. 8.)

As shown in FIG. 8, each potentiometer can include a control input. In FIG. 8, control signals to the control inputs of each potentiometer 56, 58 are shown as provided from a multiplexer 50, although in other embodiments, such control signals can be provided through or from other circuit elements or electronic entities. In some embodiments, each control signal provided to each control input of a potentiometer 47, 48 can have two states. A first state of the control signal can cause the impedance level of the potentiometer 47, 48 to which the control signal is applied to have a sufficiently high impedance so as not to pass signals (e.g., test signals from a tester) received on signal line 51. A second state of the control signal can cause the potentiometer 47, 48 to have a sufficiently low impedance to pass signals (e.g., test signals from a tester) received on signal line 51. Control signals in different states can be selectively applied to the potentiometers to put each potentiometer in either the high impedance state or the low impedance state. In this manner, any pattern of the probes 52, 54 shown in FIG. 8 can be selected to pass and block signals received on signal line 51. All other instances of circuit 46 implemented on the probe card assembly 100 (see FIG. 1) can similarly be configured to select particular patterns of probes through which to pass signals received from a signal source (e.g., a tester).

Multiplexer 50 with input 50a, bus 57, microprocessor 55, and memory 59 in FIG. 8 illustrate an exemplary circuit for controlling application of control signals to the control inputs of the potentiometers 52, 54. One or more control signals and/or inputs applied to the multiplexer 50 at input 50a can cause the multiplexer 50 to output different patterns of control signals to the potentiometers 52, 54, which as discussed above, can selectively place some of the potentiometers into a high impedance state and some into a low impedance state. As also shown, a microprocessor 55 operating under control of software (e.g., software, firmware, microcode, or any other form of programmed instructions) stored in a memory 59 can provide the control and/or input signals through a bus 57 to the multiplexer 50.

All or part of the circuit formed by the multiplexer 50, bus 57, microprocessor 55, and memory 59 can be located on the probe card assembly 100 (see FIG. 1). For example, the multiplexer 50, bus 57, microprocessor 55, and memory 59 can be located on the probe card assembly 100. As another example, the multiplexer 50 can be located on the probe card assembly 100, and the memory 59 and microprocessor 55 can be located in a tester (not shown). In such an implementation, the bus 57 can comprise channels from the tester and electrical paths through the probe card assembly 100 from channel connections in electrical connectors 104 to the multiplexer 50. As yet another example, the multiplexer 50, bus 57, microprocessor 55, and memory 59 can be located at the tester (not shown), and outputs of the multiplexer 50 can be provided to the probe card assembly 100 through channels from the tester that connect to channel connections in the electrical connectors 104 of the probe card assembly 100 (see FIG. 1).

The control circuitry comprising multiplexer 50, bus 57, microprocessor 55, and memory 59 is exemplary only, and other means can be used to provide control signals to the control inputs of the potentiometers 52, 54. For example, microprocessor 55 can be replaced in whole or in part by hardwired logic circuitry. As another example, multiplexer 50 need not be included, and microprocessor 55 can provide control signals directly to the potentiometers 52, 54 or through circuit elements other than a multiplexer (e.g., buffers). As still another example of a possible modification, all or part of the control circuitry represented by multiplexer 50, bus 57, microprocessor 55, and memory 59 can be located other than on the probe card assembly 100 or in a tester (not shown) to which the probe card assembly 100 is connected. For example all or part of that circuitry can be located in a device (other than a tester) that can be electrically connected to the probe card assembly 100.

Consistent with the discussion above, for the sake of clarity in the drawings, only a single probe is shown for each DUT probe group that is connected to each DUT 56, 58 in FIG. 8. In the usual case there are, of course, a number of probes from each DUT probe group connected to terminals on each DUT 56, 58, each probe having a corresponding digital potentiometer connection as shown in FIG. 8. In addition, in the exemplary embodiment, a total of 102 DUT probe groups are wired in parallel as show in FIG. 8. As will be seen, this permits switching between two different groups of 51 DUT probe groups. As with previously described embodiments, numbers of DUT probe groups may be used that are more or greater than the 102 used in this example. And the two different groups of DUT probe groups may be equal in number and be greater or less than 51 DUT probe groups or they may have differing numbers of DUT probe groups in each group.

Considering now the operation of the circuit of FIG. 8, processor 55 can be programmed in a known manner to apply control signals, via multiplexer 50, to each potentiometer 47, 48. The control signals can have two states. As discussed, a first state of the control signal can cause the impedance level of the potentiometer or potentiometers to which the control signal or signals are applied to have a sufficiently high impedance so as not to pass signals (e.g., test signals from a tester) received on signal line 51. A second state of the control signal can cause a potentiometer to have a sufficiently low impedance to pass signals (e.g., test signals from a tester) received on signal line 51. Control signals in different states can be selectively applied to the potentiometers to put each potentiometer in either the high impedance state or the low impedance state. This functionality can be used to create a first predetermined pattern of DUT probe groups that are operational for testing, as shown in FIG. 4. After the operational probe groups and corresponding DUTs are moved relative to one another to bring the probes into pressure contact with the DUTs, as shown in FIG. 4, testing proceeds in a known manner, and the probes are removed. The circuit depicted in FIG. 8 can then used to create a second predetermined pattern of operational DUT probe groups, as shown in FIG. 5. The probes are again brought into contact with the wafer and testing again proceeds.

Turning now to FIG. 9, in another embodiment, structure that corresponds to previously described structure is identified with the same numeral. The circuit of FIG. 9 includes resistors 60, 62, each in parallel with a switch 64, 66. Although three resistors and switches are shown and two resistors are labeled 60, 62 and two switches 64, 66 are labeled in FIG. 9, more or fewer resistors and switches can be used, and references herein to resistors 60, 62 or switches 64, 66 refers to some or al of the resistors or switches, respectively, in FIG. 9. In the configuration shown in FIG. 9, each resistor 60, 62 and its associated switch 60, 62, in essence, takes the place of a potentiometer in the configuration shown in FIG. 8. The impedance values of the resistors 60, 62 can be sufficiently high to effectively prevent signals received on signal line 51 from passing, and a switch 64, 66, while closed, can provide a low impedance by-pass electrical path by-passing its associated resistor while closed and thus allowing signals received on signal line 51 to pass to the associated probe 52, 54. The configuration shown in FIG. 9 can otherwise be like and can be configured and operated like the configuration shown in FIG. 8.

Switches 64, 66 may be mechanical, such as relay contacts, or may be solid-state switches. The opening and closing of the switches can be under control of the programmed processor 55 or can be controlled using any the alternatives discussed above with respect to FIG. 8. As mentioned, the FIG. 9 embodiment can function like the FIG. 8 embodiment except that opening and closing of the switches 64, 66 is used to effectively connect, when a switch is closed, and disconnect, when a switch is open, each probe 52, 54 to signal line 51. For example, the impedance value of the resistors (e.g., 60, 62) can be sufficiently high to effectively prevent signals (e.g., test signals from a tester to which signal line 51 is connected) received on signal line 51 from passing through the resistor.

Figure 10:
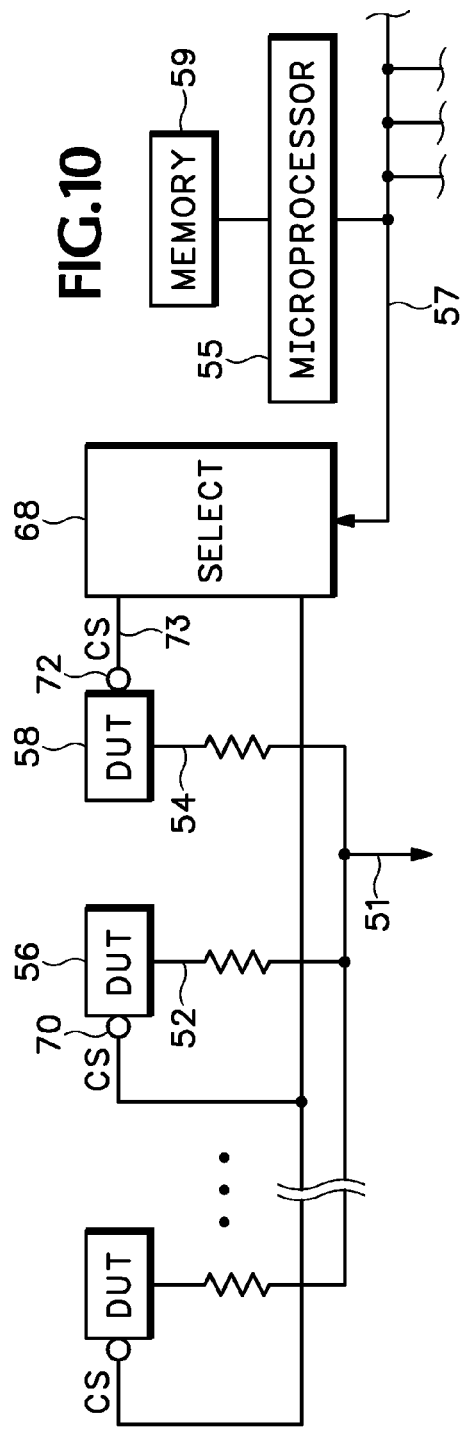
FIG. 10 is a highly schematic view of a portion of a circuit constructed in accordance with some embodiments of the invention and of DUTs designed to operate with this circuit.

FIG. 10 illustrates an embodiment that can be generally similar to the embodiments of FIGS. 8 and 9 except a chip select terminals can be provided on each DUT 56, 58. The chip select terminal of a particular DUT can be configured to selectively connect and disconnect circuitry internal to the particular DUT to or from input and/or output terminals (not shown in FIG. 10) of the particular DUT. Each DUT 56, 58 in FIG. 10 is shown with a chip select terminal 70, 72.

In the embodiment of FIG. 10, a chip select controller 68 can operate under control of the programmed processor 55 or under control of any of the control variations described above with respect to FIG. 8. A chip select controller 68 can be on a probe card assembly like probe card assembly 100 of FIG. 1. Programmed processor 55 can also be on such a probe card assembly 100 or in a tester. This embodiment relies on appropriate DUTs formed on the wafer to have a chip select (CS) terminal 70, 72. During testing, probes, like probe 73, can contact the CS terminal 70, 72 of the DUTs 56, 58, and the selector 68 can control the state of the signal applied to the CS terminal 70, 72 of each of the DUTs 56, 58. The chip select terminals 70, 72 may be designed into the DUTs with the intention of facilitating the testing process or may be part of the DUT design that was contemplated in the finished device.

In any event, referring to DUT 58, while the chip select terminal 72 is in a first state responsive to a voltage appearing on probe 73, the input and/or output terminals (not shown in FIG. 10 but which can be like terminals 108 of FIG. 1) of DUT 58 are coupled (e.g., electrically connected) to the internal circuitry of DUT 58, which means that DUT 58 is connected to signal line 51 through probe 54. When, however, the chip select terminal 72 is in a second state, the DUT 58 internal circuitry is uncoupled from the input and/or output terminals of the DUT 58. In this state, although probe 54 is electrically connected to the input and/or output terminals of DUT 58, test signals on signal line 51 are not input into the DUT 58. This is accomplished in a known manner, e.g., by placing at least some of the DUT terminals in high impedance or floating state in response to application of the second state to the chip select terminal. The chip select terminals on the other DUTs in FIG. 10 can operate like the chip select terminal 72.

The resistors shown in FIG. 10 connected to probes 52, 54 are optional. They may be used to provide some isolation between DUTs 56, 58 during testing. Thus, the resistors can be sized with a sufficiently low impedance to allow test signals to pass but with a sufficiently high impedance to isolate one probe from a fault at a DUT with which another of the probes is in contact.

The embodiment of FIG. 10 can operate as described above with the programmed chip selection occurring to create the patterns of FIGS. 4 and 5 during the testing process. It should be appreciated that in any of the embodiments, switching between the predetermined patterns of FIGS. 4 and 5 can occur without removing the probes from the DUT terminals. In addition, more than two patterns can be created during testing and different numbers of DUT probe groups can be made into patterns of any shape. Any of these embodiments can be effectively implemented in a probe group like that shown in co-pending U.S. patent application Ser. No. 11/028,940 for Probe Head Arrays, which is also assigned to the assignee of this application. The invention can also be implemented with any other type of probe card, such as a needle card, cobra card, a membrane card, or any other suitable probe card.

Figure 11:
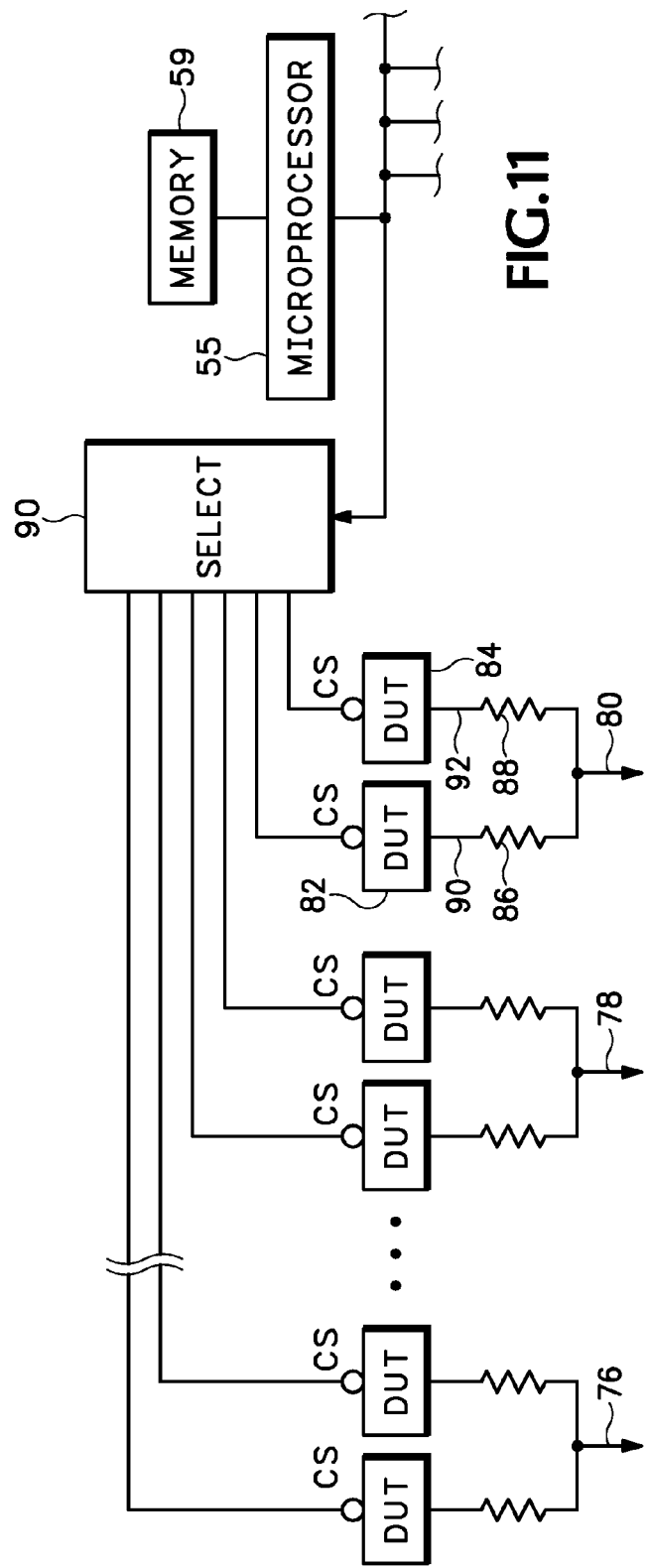
FIG. 11 is a highly schematic view of a portion of a circuit constructed in accordance with some embodiments of the invention and of DUTs designed to operate with this circuit.

The embodiment of FIG. 11 is similar to that of FIG. 10 except that in FIG. 11, a single tester channel (e.g., connected to one of signal lines 76, 78, 80) may drive more than one input to one or more DUT probes 90, 92 during a single test. Signal lines 76, 78, 80 can be generally similar to and can be configured and electrically connected to a channel connection in the electrical connectors 104 of the probe card assembly 100 of FIG. 1 as discussed above with respect to FIG. 8. A non-limiting example of driving multiple probes is disclosed in U.S. Pat. No. 6,452,411. As can be seen in an exemplary embodiment of FIG. 11, a plurality of lines 76, 78, 80 can be connected to different communications channels from a tester (not shown). For example, each of lines 76, 78, 80 can be part of a probe card assembly, like probe card assembly 100 of FIG. 1, and can be connected by one of the electrically conductive paths discussed above with respect to FIG. 1 to a channel connection in the electrical connectors 104. Each of lines 76, 78, 80 can be connected to isolation resistors, like line 80 is connected to isolation resistors 86, 88. The isolation resistors in FIG. 11 can be like and can be sized like the resistors of FIG. 10. The other sides of resistors 86, 88 can be connected to probes 90, 92, each being in a different DUT probe group but connected to a single tester channel via line 80. In the FIG. 11 embodiment, probes 90, 92 are shown pressure connected to terminals on DUTs 80, 84, respectively. As with FIG. 10, all of the probes associated with each DUT probe group are not shown to simplify the drawing. It will be appreciated that each DUT probe group, e.g., the DUT probe group that is pressure connected to DUT 84, can have numerous probes, each ultimately connected to channel connection in the electrical connectors 104 of FIG. 1. Like the FIG. 10 embodiment, each of the chip select CS terminals on the DUTs, like the CS terminal on DUT 84, can be connected to a selector 90 (which can be like 68 of FIG. 10) via probes that are pressure connected to each of the chip select CS terminals.

Operation of the embodiment of FIG. 11 can be similar to that of FIG. 10 The chip select signals can be set to permit simultaneous testing of two DUTs by a single tester channel. Alternatively, the chip select signals could be selected so that only one DUT is operative for testing in each channel during a single test. Or some DUTs could be selected for simultaneous testing by a single channel by applying the appropriate signal on each of the CS terminals in that channel while other DUTs may have one DUT selected and one DUT not in a single channel. This flexibility provides for multiple ways in which different patterns, such as those shown in FIGS. 4 and 5 and in FIGS. 6 and 7, during different touchdowns may be selected for testing to optimize a test procedure.

The invention claimed is:

1. A contactor device comprising:
   an electrical interface to a plurality of communications channels from a tester;
   a plurality of electrically conductive probes disposed to contact electronic devices to be tested;
   electrically conductive paths electrically connecting the electrical interface and ones of the probes, a first one of the electrical paths electrically connecting a first one of the communications channels to a first set of more than one of the probes; and means for selecting fewer than all of the probes in the first set of probes through which to provide test signals from the first communication channel to at least one of the electronic devices.

2. The probe card assembly of claim 1, wherein:

the first set of probes comprises at least three probes, and the means for selecting is configured to select as a first combination any combination of fewer than all of the probes in the first set of probes through which to provide the test signals.

3. The probe card assembly of claim 1, wherein the means for selecting comprises a plurality of potentiometers each disposed in the first electrical path between the electrical interface and one of the probes of the first set of probes.

4. The probe card assembly of claim 3, wherein each of the potentiometers comprises a control input that controls an amount of impedance of the potentiometer.

5. The contactor device of claim 4, wherein:

while the control input is in a first state, the impedance of the potentiometer is sufficiently high to effectively prevent test signals from passing through the potentiometer, and while the control input is in a second state, the impedance of the potentiometer is sufficiently low to effectively allow test signals to pass through the potentiometer.

6. The probe card assembly of claim 1 further comprising a plurality of resistors each disposed in the first electrical path between the electrical interface and one of the probes of the first set of probes.

7. The probe card assembly of claim 6, wherein the means for selecting comprises a plurality of by-pass switches each configured to, while closed, provide an electrical path by passing one of the resistors.

8. The contactor device of claim 7, wherein the impedance level of each of the resistors is sufficiently high to effectively prevent test signals from passing through the resistor.

9. The probe card assembly of claim 8, wherein each of the switches comprises a control input that controls whether the switch is open or closed.

10. The probe card assembly of claim 1, wherein the probes in the first set of probes are configured to contact a first set of the electronic devices, and the means for selecting comprises a second plurality of probes each configured to contact an enable input on one of the first set of electronic devices.

11. The contactor device of claim 1, wherein the contactor device comprises a probe card assembly.

12. An apparatus for testing a plurality of semiconductor devices comprising:

a chip select port on at least one of the devices that couples contacts on the device to internal circuits within the device in response to a first state on the port and that uncouples contacts on the device from the internal circuits in response to a second state on the port;

a plurality of groups of test probes, each group of test probes configured to contact one of the devices;

a tester having a plurality of groups of tester channels, each group of tester channels configured to correspond to one of the groups of test probes, wherein a number of the groups of tester channels is less than a number of the groups of test probes, and at least one of the groups of tester channels is connected to more than one of the groups of test probes via conductors disposed between the tester channels and the test probes; and a processor programmed to selectively apply the first and second states to the chip select port during testing of the devices.

13. The apparatus of claim 12, wherein the processor is programmed to connect a first predetermined pattern of the groups of test probes to the groups of tester channels during a first touchdown of ones of the probes onto contacts of a first group of the devices and to connect a second predetermined pattern of the groups of test probes to the groups of tester channels during a second touchdown of ones of the probes onto contacts of a second group of the devices.

14. The apparatus of claim 13, wherein said first and second predetermined patterns are different from one another.

15. The apparatus of claim 12, wherein when the groups of test probes touch contacts on corresponding devices and said first state is asserted, the one device is effectively connected to a first of the groups of tester channels.

16. The apparatus of claim 12, wherein when the groups of test probes touch contacts on corresponding devices and said second state is asserted, the one device is effectively disconnected from the first of the groups of tester channels.

17. The apparatus of claim 12, wherein the groups of test probes are part of a probe card assembly.

18. The apparatus of claim 12, wherein the devices are formed on a semiconductor wafer.

* * * * *